United States Patent
Tanaka et al.

[11] Patent Number: 5,899,750
[45] Date of Patent: May 4, 1999

[54] FINE PROCESSING METHOD

[75] Inventors: Hiroshi Tanaka, Toyokawa; Yoshitsugu Abe, Anjo; Koji Matsumoto, Kariya; Kazuyuki Inoue, Owariasahi, all of Japan

[73] Assignee: Denso Corporation, Kariya, Japan

[21] Appl. No.: 08/814,936

[22] Filed: Mar. 12, 1997

[30] Foreign Application Priority Data

Mar. 12, 1996  [JP]  Japan ..................... 8-055168

[51] Int. Cl.⁶ ............................. H01L 21/302
[52] U.S. Cl. .................. 438/753; 438/942; 438/703
[58] Field of Search .................. 438/753, 942, 438/703; 216/99

[56] References Cited

U.S. PATENT DOCUMENTS

| | | | |
|---|---|---|---|
| 3,874,919 | 4/1975 | Lehman | 117/212 |
| 4,882,933 | 11/1989 | Petersen et al. | 73/517 R |
| 4,901,133 | 2/1990 | Curran et al. | 357/54 |
| 5,126,288 | 6/1992 | Nakagawa | 437/228 |
| 5,591,494 | 1/1997 | Sato et al. | 427/579 |

FOREIGN PATENT DOCUMENTS

| | | |
|---|---|---|
| 71203 | 2/1983 | European Pat. Off. . |
| 7-29836 | 1/1995 | Japan . |

OTHER PUBLICATIONS

"Effects of Oxygen On the Physical Properties of Silicon Nitride Layers"; Heinz; Abstract Only; Int. Wiss Kolloq.–Tech. Hochsch. Ilmenau (1978'), 23 (6), 93–5.

*Primary Examiner*—Bruce Breneman
*Assistant Examiner*—George Goudreau
*Attorney, Agent, or Firm*—Pillsbury Madison & Sutro LLP

[57] ABSTRACT

In a fine processing method for forming a silicon substrate, first, an oxynitride layer is formed on the silicon substrate. Thereafter, a silicon nitride layer is formed on the oxynitride layer and patterned into a predetermined shape to cause it to function as an etching mask. The silicon substrate is etched through the etching mask. In this case, because of the oxynitride layer formed between the silicon substrate and the silicon nitride layer, an interface between the silicon substrate and the silicon nitride layer is not easily eroded in the etching process. As a result, processing accuracy of the substrate is improved.

13 Claims, 5 Drawing Sheets

↓ A

↓ B

↓ C

↓ D

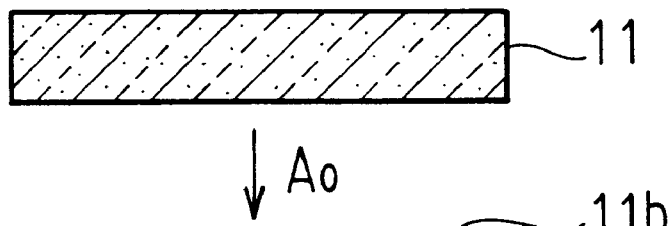
FIG. 7A
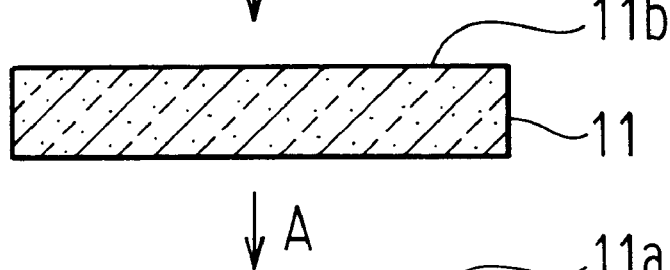
FIG. 7B
FIG. 7C
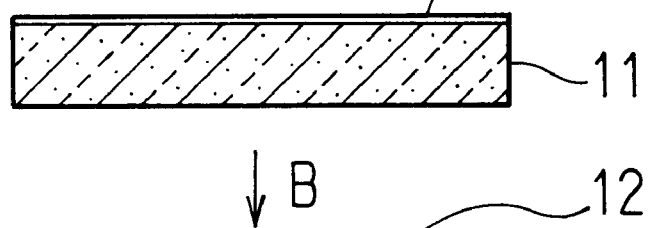
FIG. 7D
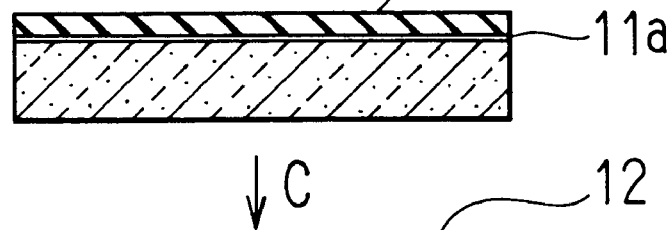
FIG. 7E
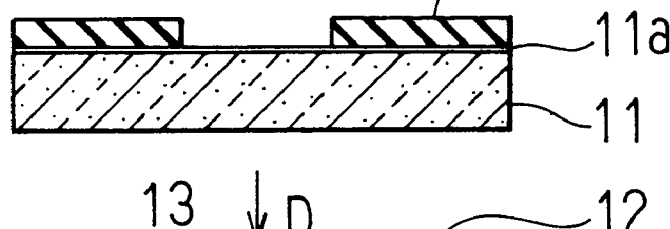
FIG. 7F
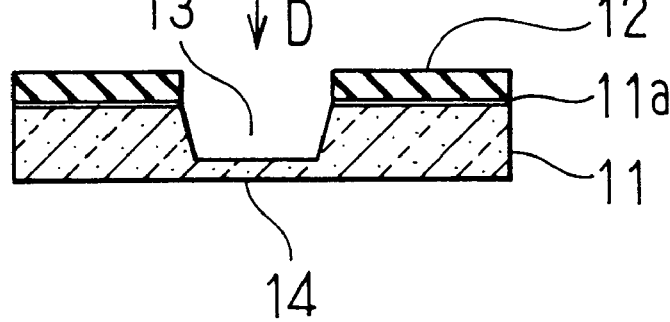

FINE PROCESSING METHOD

CROSS REFERENCE TO RELATED APPLICATION

This application is based upon and claims the benefit of priority of the prior Japanese Patent Application No. 8-55168 filed on Mar. 12, 1996, the contents of which are incorporated herein by reference.

BACKGROUND OF THE INVENTION

1. Field of the Invention

The present invention relates to a fine processing method including an etching process suitable for producing a semiconductor device.

2. Related Arts

To produce a semiconductor device, for example used as a semiconductor pressure sensor, conventionally, a silicon nitride (SiN) layer is formed on a silicon substrate, and etched by a photo-etching process into a predetermined shape to cause it to function as an etching mask. The silicon substrate on which the etching mask is formed is immersed in an etching solution (for example, a water solution of potassium hydroxide (KOH)), and etched through the etching mask. Accordingly, as shown in FIG. 9, a recess portion 22 of a predetermined shape is formed on the silicon substrate 21 so that a thin silicon diaphragm 24 is formed at the bottom of the recess portion 22.

In the etching process, because the SiN layer 25 functioning as the etching mask has sufficient strength and adhesive property to the silicon substrate 21, the etching mask is not easily cracked or separated from the silicon substrate 21. As shown in FIG. 9, however, inadequate erosion portions 23 are generated on the silicon substrate 21 exposed to the recess portion 22. Consequently, variation in the geometry of the recess portion 22 occurs, whereby dimensional accuracy of the diaphragm 24 is deteriorated.

SUMMARY OF THE INVENTION

The present invention has been made in view of the above-mentioned problem and an object of the present invention is to provide a fine processing method suitable for producing a semiconductor device, and more particularly to provide a fine processing method including an etching process capable of preventing an inadequate erosion portion of a substrate in the etching process in order to improve processing accuracy of the substrate.

In a fine processing method according to the present invention, an oxynitride layer is formed on the substrate. Thereafter, a nitride layer is formed on the oxynitride layer and patterned into a predetermined shape by a photo-etching step to cause it to function as an etching mask. The substrate is immersed into an etching solution and etched through the etching mask.

In the fine processing method, because the oxynitride layer is formed between the substrate and the etching mask, the oxynitride layer provides an interface which has good resistance to chemical erosion. Further, because the nitride layer is formed on the oxynitride layer, an atomic percentage of nitrogen included in the oxynitride layer is increased. Therefore, the resistance of the interface to chemical erosion is further improved. As a result, fine processing can be performed without any inadequate erosion portions generated in the substrate. As a result, processing accuracy of the substrate is improved.

Preferably, the atomic percentage of nitrogen among the total number of atoms forming the oxynitride layer is approximately in the range of 10 at % to 60 at %.

Preferably, the oxynitride layer is formed in an atmosphere including $NH_3$ gas and $N_2$ gas, or only $NH_3$ gas by a plasma process. In the case that the atmosphere includes $NH_3$ gas and $N_2$ gas, it is desirable that the atmosphere is controlled so that an amount of $NH_3$ gas is larger than that of $N_2$ gas. As a result, the atomic percentage of nitrogen in the oxynitride layer is effectively increased.

In virtue of the oxynitride layer formed on the surface of the substrate, familiarity of the nitride layer to the substrate is improved, whereby the nitride layer can be joined firmly to the substrate.

Other objects and features of the present invention will become more readily apparent from a better understanding of the preferred embodiments described below with reference to the following drawings.

BRIEF DESCRIPTION OF THE DRAWINGS

FIGS. 7A to 7F are cross-sectional views showing production steps for forming a diaphragm and a recess portion on a silicon substrate in a fourth embodiment;

DETAILED DESCRIPTION OF THE PREFERRED EMBODIMENTS

Embodiments according to the present invention will be described hereinunder with reference to the drawings.

In a first embodiment, production steps for producing a silicon diaphragm 4 by an etching process will be explained by referring to FIGS. 1A to 1E.

Figure 2:
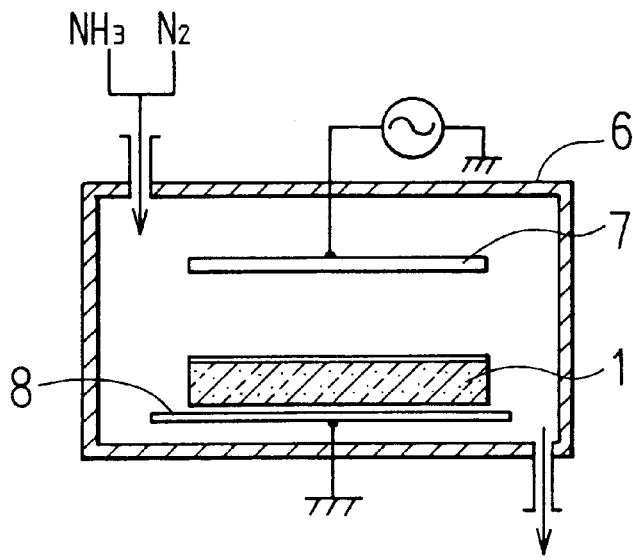
FIG. 2 is a cross-sectional view showing a plasma enhanced CVD apparatus and the silicon substrate installed therein in a step A in the first embodiment.

First, in a step A, an oxynitride layer 1a is formed on an upper surface of a silicon substrate 1, which is made of a silicon wafer of mono-crystal silicon. That is, as shown in FIG. 2, the silicon substrate 1 is put in a chamber 6 of a plasma chemical vapor deposition (PCVD) apparatus, and then an oxidation-nitriding plasma process is performed on the silicon substrate 1.

In the oxidation-nitriding process, ammonia ($NH_3$) gas and nitrogen ($N_2$) gas are mixed and introduced into the chamber. Flow rates of $NH_3$ gas and $N_2$ gas are 600 sccm and 500 sccm (sccm: cc/minute under a normal condition), respectively. Thereafter, a high-frequency power of 600 W is applied to electrodes 7 and 8 so that electric discharge occurs between the electrodes 7 and 8 for 90 seconds.

Accordingly, cold-plasma is generated within the chamber 6 containing $NH_3$ gas and $N_2$ gas, to cause chemical reaction. As a result, the oxynitride layer 1a is formed on the silicon substrate 1.

A compositional analysis (X-ray photoelectron spectroscopy: XPS analysis) is performed on the surface of thus treated silicon substrates 1. The results are indicated in the following TABLE 1 compared with the silicon substrates 1, which is not treated by the oxidation-nitriding plasma process.

The silicon substrate 1 treated by the oxidation-nitriding plasma process has a surface composition approximately containing nitrogen of 14 at % and oxygen of 40 at % to the total number of atoms of silicon, oxygen, and nitrogen. The atomic percentages of the nitrogen and the oxygen in the surface composition of the silicon substrate 1 are increased by the oxidation-nitriding plasma process.

TABLE 1

|  | atomic percentage of nitrogen (at %) | atomic percentage of oxygen (at %) |
|---|---|---|
| Before oxidation-nitriding plasma process | — | 32 |
| After oxidation-nitriding plasma process | 14 | 40 |

Figure 3:
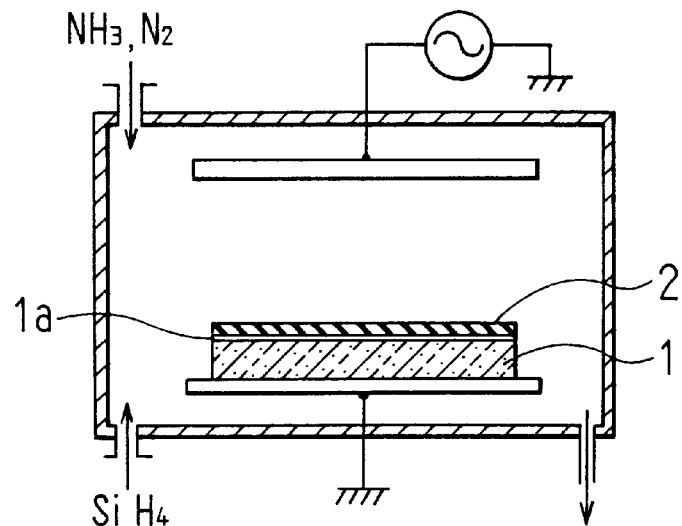
FIG. 3 is a cross-sectional view showing the plasma enhanced CVD apparatus and the silicon substrate installed therein in a step B in the first embodiment.

Next, in a step B, a silicon nitride (SiN) layer 2 is deposited on the silicon substrate 1 through the oxynitride layer 1a. In order to deposit the silicon nitride layer 2, as shown in FIG. 3, the silicon substrate 1 is put in the chamber of the PCVD apparatus. Thereafter, silan ($SiH_4$), $NH_3$, and $N_2$ gases are introduced into the chamber at flow rates of 1000 sccm, 3300 sccm, and 900 sccm, respectively. A high-frequency power of 600 W is applied to the electrodes 7 and 8 so that electric discharge occurs between the electrodes 7 and 8 for 90 seconds. In this state, cold-plasma is generated in the chamber to cause chemical reaction, whereby the silicon nitride layer 2 is deposited on the oxynitride layer 1a.

According to the secondary ion mass spectroscopy (SIMS) analysis of the oxynitride layer 1a, the thickness of the oxynitride layer 1a formed between the silicon substrate 1 and the silicon nitride layer 2 was approximately 0.1 μm.

The plasma process for forming the silicon nitride layer 2 in the step B may be performed successively in the same chamber as that used in the step A for forming the oxynitride layer 1a, as well as in the different chamber from that used in the step A.

Figure 1A:
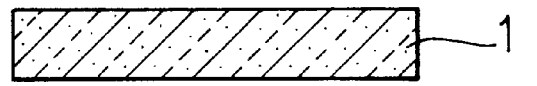
FIGS. 1A to 1E are cross-sectional views showing production steps for forming a recess portion and a diaphragm on a silicon substrate by an etching process in a first embodiment according to the present invention.
Figure 1B:
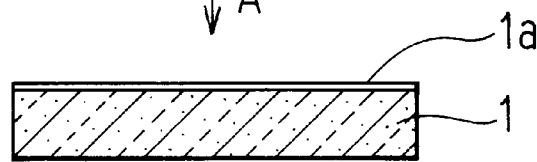
Figure 1C:
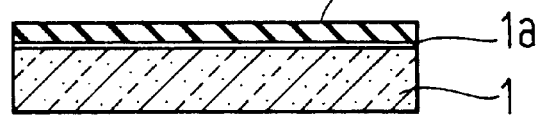
Figure 1D:
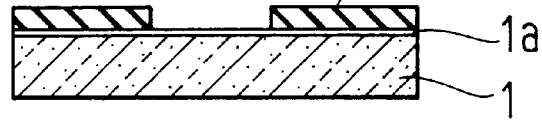
Figure 1E:
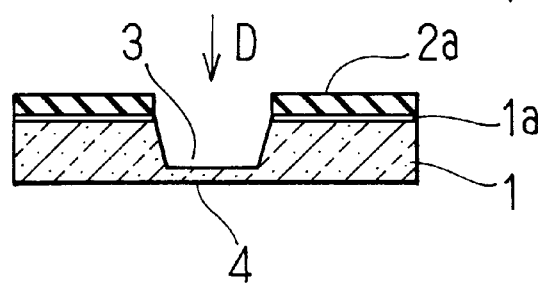

Next, in a step C, the silicon nitride layer 2 is patterned to form an etching mask 2a by photo etching as shown in FIG. 1D. First, a photoresist layer is coated on the silicon nitride layer 2, and then a mask of a predetermined shape corresponding to a shape of a recess portion 3 for forming a diaphragm is disposed on the photoresist layer. The photoresist layer is exposed by ultraviolet rays or the like through the mask, and then developed. The exposed area of the photoresist layer is hardened and remains on the silicon substrate 1, and the other area of the photoresist layer is dissolved and removed from the silicon substrate 1 along with the silicon nitride layer 2 in the developing treatment. As a result, the etching mask 2a having an opening for forming the diaphragm 4 is provided on the silicon substrate 1.

Next, in a step D, the silicon substrate having the etching mask 2a is immersed into a potassium hydroxide (KOH) water solution of 32 wt % at a temperature of 110° C., and the etching process is performed on the silicon substrate 1. As a result, the recess portion 3 is formed on the silicon substrate 1 so that the diaphragm 4 having a predetermined thickness is formed at the bottom of the recess portion 3. In this etching process, the other alkaline water solutions can be adopted instead of the KOH water solution as the etching solution.

Figure 4:
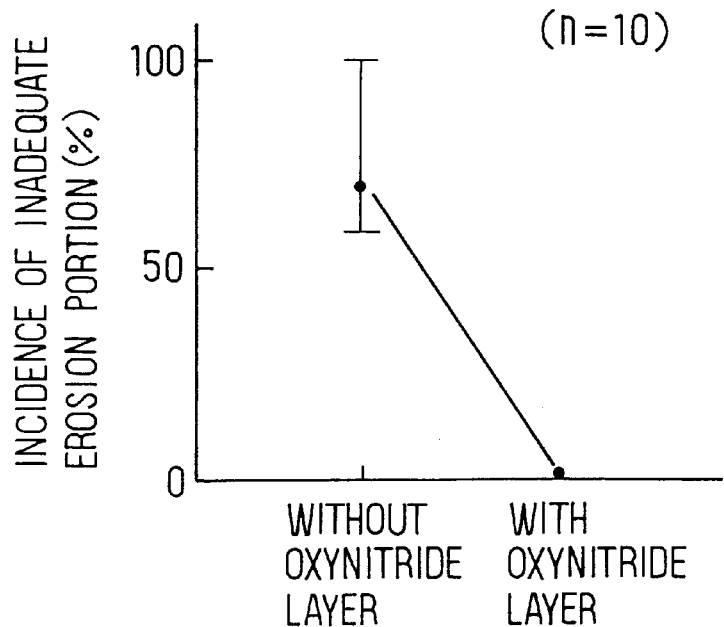
FIG. 4 is a graph showing incidence of inadequate erosion portions in the first embodiment.

FIG. 4 shows incidences of the inadequate erosion portions generated at the periphery of the recess portions 3 of the silicon substrates 1 in the above-mentioned etching process. The incidences are evaluated with respect to both cases that the oxynitride layer is formed and is not formed on the silicon substrate 1. In these production steps, the number of the silicon substrates 1 formed on the same silicon wafer at the same time is approximately 700, and the incidence of the inadequate erosion portions represents a ratio of the number of the silicon substrates 1 having the inadequate erosion portions to the total number of the silicon substrates 1 formed on the same silicon wafer. It is noted that the number of silicon wafers evaluated as mentioned above are ten, respectively with respect to both cases that the oxynitride layer is formed and is not formed on the silicon substrate 1.

As shown in FIG. 4, in the case that the oxynitride layer 1a is not formed on the silicon substrate 1, the incidence of the inadequate erosion portions is approximately in the range of 60% to 100% (the average value is approximately 70%). As opposed to this, in the case that the oxynitride layer 1a is formed, the incidence of the inadequate erosion portions approximately becomes 0%.

Figure 5:
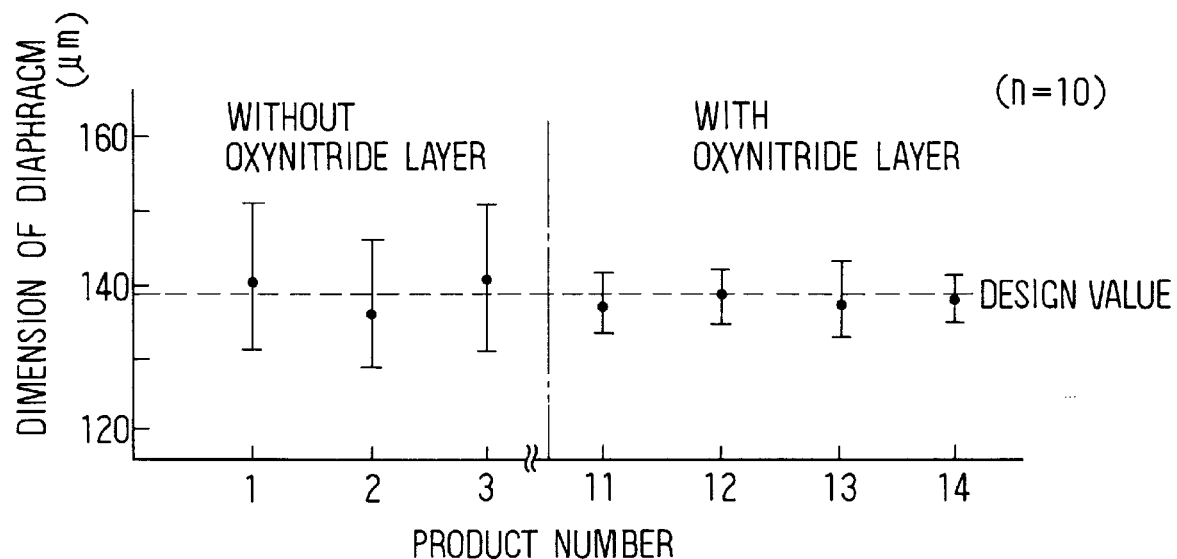
FIG. 5 is a graph showing dimensional variation of the diaphragm in the first embodiment.

FIG. 5 shows dimensional variation of the diaphragms 4 with both cases that the oxynitride layer 1a is formed and is not formed on the silicon substrate 1. In the case that the oxynitride layer 1a is not formed, the dimension of the diaphragm 4 varies approximately in the range of 130 μm to 150 μm. As opposed to this, in the case that the oxynitride layer is formed, the dimension of the diaphragm 4 falls approximately in the range of 135 μm to 145 μm. That is, the dimensional variation of the diaphragm 4 becomes approximately half by the oxynitride layer 1a.

As mentioned-above, when the silicon nitride layer 2 is formed on the silicon substrate 1 after the oxidation-nitriding plasma process, the oxynitride layer 1a is formed between the silicon substrate 1 and the silicon nintride layer 2. Therefore, the interface between the silicon substrate 1 and the silicon nitride layer 2 is not easily eroded in the etching process.

Next, the other embodiments will be described.

In a second embodiment, in the step A, when the oxidation-nitriding plasma process is performed on the silicon substrate 1 in order to deposit the oxynitride layer 1a, the flow rates of $NH_3$ and $N_2$ gases, which are to be mixed and introduced into the chamber, are set to be 800 sccm and 300 sccm, respectively. The other features are the same as those in the first embodiment.

In a third embodiment, in the step A, only $NH_3$ gas is introduced into the chamber at a flow rate of 1000 sccm in order to deposit the oxynitride layer 1a on the silicon substrate 1. The other features are the same as those in the first embodiment.

TABLE 2 shows a result of a compositional analysis performed with respect to the surfaces of the oxynitride layers 1a formed on the silicon substrates 1 under the conditions in the second and the third embodiments.

TABLE 2

| NH₃/N₂ gas flow rate | atomic percentage of nitrogen (at %) | atomic percentage of oxygen (at %) |
|---|---|---|
| 800/300 sccm | 14 | 39 |
| 1000/0 sccm | 15 | 40 |

As shown in TABLE 2, when the flow rates of $NH_3$ and $N_2$ gases are 800 sccm and 300 sccm respectively, the atomic percentage of the nitrogen is approximately 14 at %, while the atomic percentage of the oxygen is approximately 39 at %. As compared with the silicon substrate 1 without having the oxynitride layer 1a, it is apparent that the atomic percentages of the nitrogen and the oxygens increase as shown in TABLES 1 and 2. Further, according to the above-mentioned embodiments, when the flow rate of $NH_3$ gas is much larger than that of $N_2$ gas, the atomic percentage of the nitrogen in the oxynitride layer 1a increases.

Figure 6:
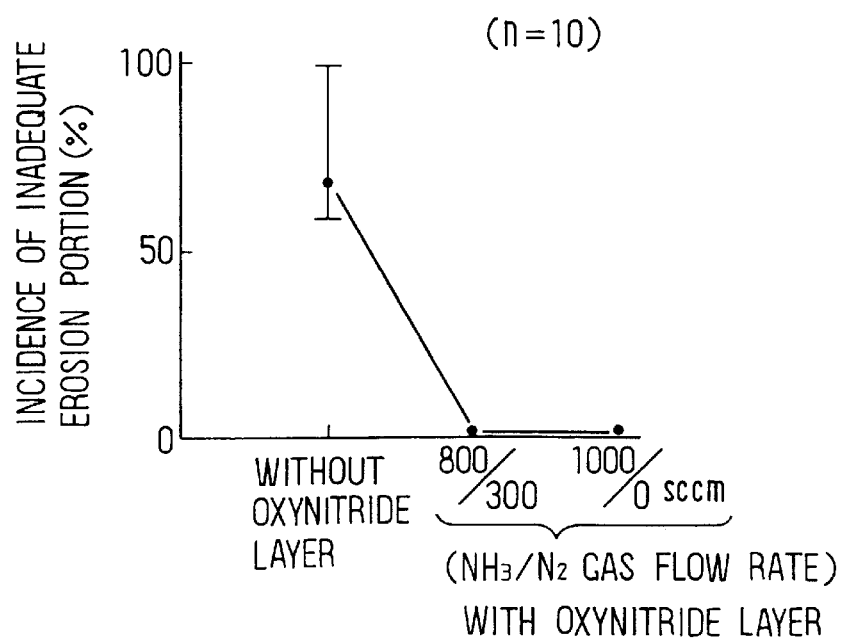
FIG. 6 is a graph showing incidences of inadequate erosion portions in a second and third embodiments.

FIG. 6 shows the incidences of the inadequate erosion portions of the diaphragms 4 formed on the silicon substrates 1 on which the oxynitride layer 1a is formed under the conditions in the second and the third embodiments. In the case that the oxynitride layer 1a is not formed on the silicon substrate 1, the incidence of the inadequate erosion portions is approximately in the range of 60% to 100% (the average value is approximately 70%). As opposed to this, when the oxynitride layer 1a is formed on the silicon substrate 1 under the condition that the flow rates of $NH_3$ and $N_2$ gases are 800 sccm and 300 sccm, or 1000 sccm and 0 sccm, the incidence of the inadequate erosion portions becomes approximately zero.

FIGS. 7A to 7F show production steps for producing a diaphragm 14 on a silicon substrate 11 by the etching process in a fourth embodiment. The production steps in the fourth embodiment includes a step $A_0$ before performing the step A, in addition to the steps A to D in the first embodiment.

In the step $A_0$, an oxygen plasma process is performed on the silicon substrate 11 to form an oxide layer 11b on the silicon substrate 11. That is, the silicon substrate 11 is put in the chamber of the PCVD apparatus. This chamber is filled with oxygen ($O_2$) gas at a pressure of 0.8 Torr. Thereafter, a high-frequency power of 200 W is applied to electrodes to produce electric discharge, whereby cold-plasma is generated between the electrodes for 10 minutes. Accordingly, the oxide layer 11b is formed on the silicon substrate 11. The other features in the fourth embodiment are the same as those in the first embodiment.

That is, in the step A, after the silicon substrate 11 is installed in the chamber of the PCVD apparatus, the oxidation-nitriding plasma process is performed on the silicon substrate 11 to form an oxynitride layer 11a on the oxide layer 11b.

Next, in the step B, a silicon nitride layer 12 is formed on the oxide layer 11b and the oxynitride layer 11a. In the step C, the silicon nitride layer 12 is patterned to form an etching mask 12a by photo etching.

Further, in the step D, the silicon substrate 11 having the etching mask 12a is immersed into the KOH water solution to be etched. Accordingly, a recess portion 13 is formed on the silicon substrate 11 so that a diaphragm 14 having a predetermined thickness is formed at the bottom of the recess portion 13.

TABLE 3 shows a result of a compositional analysis performed with respect to the surface of the silicon substrate 11 before and after the oxygen plasma process is performed, and after the oxidation-nitriding plasma process is performed.

TABLE 3

| | atomic percentage of nitrogen (at %) | atomic percentage of oxygen (at %) |
|---|---|---|
| Before oxygen plasma process | — | 29 |
| After oxygen plasma process | — | 38 |
| After oxidation-nitriding plasma process | 13 | 39 |

When the atomic percentage of nitrogen in the oxynitride layer 11a is approximately more than 10 at %, the resistance of the interface between the silicon substrate and the silicon nitride layer against chemical erosion can be improved. Further, because the oxynitride layer includes silicon and oxygens in addition to nitrogen, it is theoretically difficult to form the oxynitride layer including nitrogen being more than 60 at %.

Figure 8:
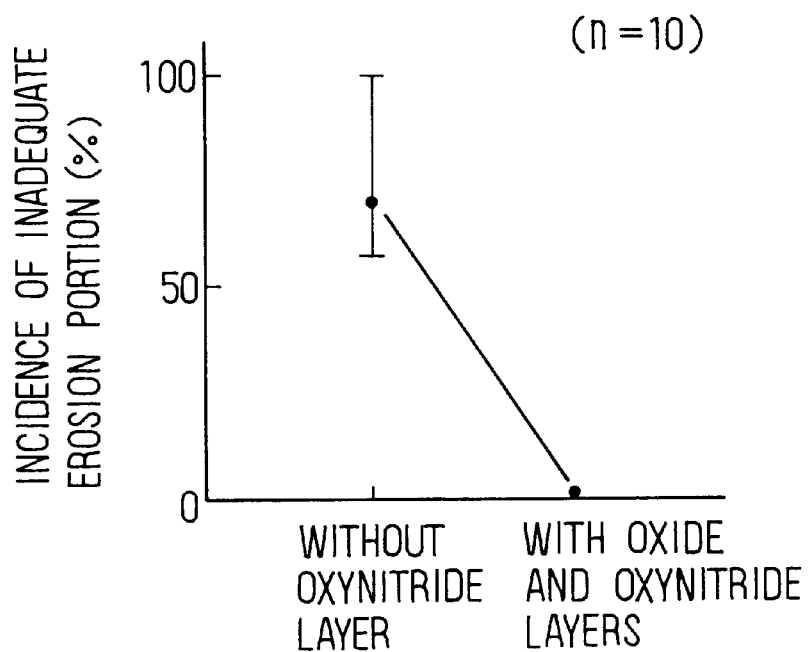
FIG. 8 is a graph showing incidences of inadequate erosion portions in the fourth embodiment.
Figure 9:
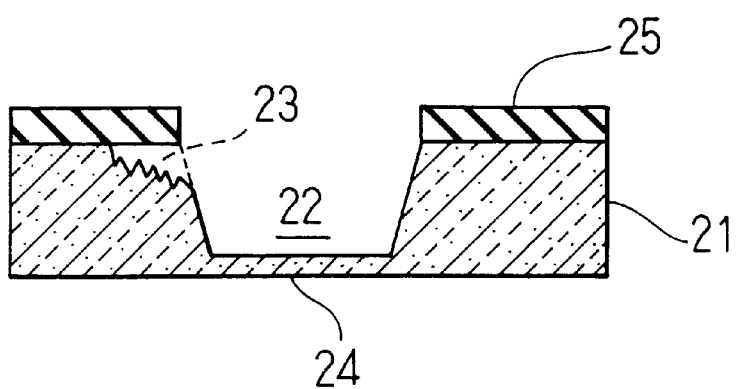
FIG. 9 is a cross-sectional view showing a recess portion and a diaphragm formed on a silicon substrate by an etching process according to a prior art.

FIG. 8 shows the incidence of the inadequate erosion portions of the diaphragms 14 formed in the forth embodiment. By forming the oxide layer 11b and the oxynitride layer 11a on the silicon substrate 11 before forming the silicon nitride layer 12, the incidence of the inadequate erosion portions approximately becomes zero.

In the above-mentioned embodiments, although the oxynitride layer is formed on the silicon substrate by the PCVD method, it may be formed by an ion implantation method, a diffusion method, or the like. Further, this invention can be adopted not only for forming a silicon diaphragm but also for forming a fine hole, a fine groove, and the like on a silicon substrate or the like.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A fine processing method for a substrate, comprising steps of:
   forming an oxynitride layer on the substrate by a plasma chemical vapor deposition method;
   forming a nitride layer on the oxynitride layer by a plasma chemical vapor deposition method;
   patterning the nitride layer into a predetermined pattern by etching to cause the nitride layer to function as an etching mask; and
   immersing the substrate on which the etching mask is formed into an alkaline etching solution, thereby anisotropically etching the substrate.

2. A fine processing method according to claim 1, wherein the substrate is a silicon substrate.

3. A fine processing method according to claim 1, wherein the oxynitride layer is formed so as to have a nitrogen corresponding to at least 10 atomic percentage therein with respect to a total number of atoms forming the oxynitride layer.

4. A fine processing method according to claim 3, wherein the oxynitride layer is formed so as to have the nitrogen which is less than 60 atomic percentage with respect to the total number of the atoms forming the oxynitride layer.

5. A fine processing method according to claim 1, wherein the etching solution is an alkaline water solution.

6. A fine processing method according to claim 1, wherein the step of forming the oxynitride layer further includes steps of:

putting the substrate within a chamber of a plasma generating apparatus;

introducing $NH_3$ gas and $N_2$ gas into the chamber; and generating plasma in the chamber in order to deposit the oxynitride layer on the substrate.

7. A fine processing method according to claim 6, wherein an atmosphere in the chamber is controlled so that an amount of $NH_3$ gas is larger than that of $N_2$ gas.

8. A fine processing method according to claim 1 further comprising a steps of forming an oxide layer on the substrate before forming the oxynitride layer.

9. A fine processing method according to claim 1, wherein the step of forming the oxynitride layer further includes steps of:

putting the substrate within a chamber of a plasma generating apparatus;

introducing $NH_3$ gas into the chamber; and generating plasma in the chamber in order to deposit the oxynitride layer on the substrate.

10. A fine processing method for a substrate, comprising steps of:

putting the substrate within a chamber of a plasma generating apparatus;

introducing a first gas containing nitrogen into the chamber;

generating plasma in the chamber for depositing an oxynitride layer on the substrate;

introducing a second gas containing silicon and a third gas containing nitrogen into the chamber;

generating plasma in the chamber for depositing a silicon nitride layer on the oxynitride layer;

patterning the silicon nitride layer into a predetermined pattern by etching to cause the silicon nitride layer to function as an etching mask; and immersing the substrate on which the etching mask is formed into an alkaline etching solution, thereby anisotropically etching the substrate.

11. A fine processing method according to claim 10, wherein the first gas includes $NH_3$ gas and $N_2$ gas.

12. A fine processing method according to claim 11, wherein an amount of $NH_3$ gas is larger than that of $N_2$ gas.

13. A fine processing method according to claim 10, further comprising a step of forming an oxide layer on the substrate before forming the oxynitride layer.

* * * * *